United States Patent
Yan

(10) Patent No.: US 12,074,062 B2
(45) Date of Patent: Aug. 27, 2024

(54) METHOD FOR MANUFACTURING SEMICONDUCTOR STRUCTURE

(71) Applicant: CHANGXIN MEMORY TECHNOLOGIES, INC., Anhui (CN)

(72) Inventor: Taoyan Yan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 479 days.

(21) Appl. No.: 17/373,914

(22) Filed: Jul. 13, 2021

(65) Prior Publication Data

US 2021/0343534 A1     Nov. 4, 2021

Related U.S. Application Data

(63) Continuation of application No. PCT/CN2021/076407, filed on Feb. 9, 2021.

(30) Foreign Application Priority Data

Feb. 28, 2020    (CN) ......................... 202010128019.X

(51) Int. Cl.
    *H01L 21/768*     (2006.01)
    *H01L 21/285*     (2006.01)

(52) U.S. Cl.
    CPC .. *H01L 21/76855* (2013.01); *H01L 21/28518* (2013.01); *H01L 21/76805* (2013.01);
(Continued)

(58) Field of Classification Search
    CPC ......... H01L 21/28518; H01L 21/76805; H01L 21/76843; H01L 21/76865;
(Continued)

(56) References Cited

U.S. PATENT DOCUMENTS 6,150,248 A * 11/2000 Sekiguchi ......... H01L 21/28518
                                                     438/533
6,207,562 B1 * 3/2001 Han .................. H01L 21/28518
                                                     438/783
(Continued)

FOREIGN PATENT DOCUMENTS

| CN | 1457095 A | 11/2003 |
|---|---|---|
| CN | 1962925 A | 5/2007 |

(Continued)

OTHER PUBLICATIONS

First Office Action of the Chinese application No. 202010128019.X, issued on Feb. 14, 2022 13 pgs.
(Continued)

*Primary Examiner* — Ratisha Mehta
*Assistant Examiner* — Brad A Knudson
(74) *Attorney, Agent, or Firm* — Kilpatrick Townsend & Stockton LLP

(57) ABSTRACT

Some examples of this disclosure relate to the field of the semiconductor technology, and disclose a method for manufacturing a semiconductor structure. The method for manufacturing of the semiconductor structure includes: providing a base, wherein the base includes a metal layer and an oxide located in the metal layer or on a surface of the metal layer; and performing heat treatment on the base, wherein a reducing gas is introduced during the heat treatment, and the metal layer is converted into a metal compound layer after the heat treatment. This disclosure can improve the performance of the semiconductor structure.

16 Claims, 5 Drawing Sheets

(52) U.S. Cl.
CPC .. *H01L 21/76814* (2013.01); *H01L 21/76843* (2013.01); *H01L 21/76865* (2013.01); *H01L 21/76889* (2013.01); *H01L 21/76895* (2013.01)

(58) Field of Classification Search
CPC ......... H01L 21/76895; H01L 21/76855; H01L 21/76814; H01L 21/76889; H01L 2221/1068
See application file for complete search history.

(56) References Cited

U.S. PATENT DOCUMENTS

| | | | |
|---|---|---|---|
| 6,777,275 | B1 | 8/2004 | Kluth |
| 2002/0086486 | A1* | 7/2002 | Tanaka ................. H01L 21/324 438/587 |
| 2003/0148606 | A1* | 8/2003 | Fortin ............... H01L 21/28518 438/653 |
| 2003/0209738 | A1 | 11/2003 | Ohto |
| 2005/0176220 | A1* | 8/2005 | Kanemoto ........ H01L 21/02381 257/E21.171 |
| 2010/0255661 | A1* | 10/2010 | Vatus ..................... C23C 16/24 438/479 |
| 2011/0124192 | A1* | 5/2011 | Ganguli ............ H01L 21/76864 438/653 |
| 2016/0351446 | A1* | 12/2016 | Yamaguchi ........... H01L 29/456 |
| 2017/0358482 | A1* | 12/2017 | Chen ................. H01L 21/76883 |

FOREIGN PATENT DOCUMENTS

| | | |
|---|---|---|
| CN | 102208377 A | 10/2011 |
| CN | 105575790 A | 5/2016 |
| CN | 108666267 A | 10/2018 |
| CN | 110911276 A | 3/2020 |

OTHER PUBLICATIONS

International Search Report in the international application No. PCT/CN2021/076407, mailed on Apr. 28, 2021, 2 pgs.

Takuya Futase, et al. "Disconnection of NiSi shared contact and its correction using NH3 soak treatment in Ti/TiN barrier metallization", IEEE International Reliability Physics Symposium, Jun. 17, 2010, pp. 995-1000.

C. Detavernier, et al., "The influence of Ti capping layers on CoSi 2, formation", Microelectronic Engineering, 2000, pp. 125-132, vol. 50.

J.H. Park, et al., "The Effect of CoSi2 Formation Process on the CMOS Transistor Electrical Properties for Sub 100nm Memory Applications", ECS Transactions, 2015, 69(5): 123-139.

* cited by examiner

METHOD FOR MANUFACTURING SEMICONDUCTOR STRUCTURE

CROSS-REFERENCE TO RELATED APPLICATION

This application is a U.S. continuation application of International Application No. PCT/CN2021/076407 filed on Feb. 9, 2021, which claims priority to Chinese patent application No. 202010128019.x filed on Feb. 28, 2020. Both of them are hereby incorporated by reference in their entirety.

TECHNICAL FIELD

The examples of this disclosure relate to the field of semiconductor manufacturing, and particularly relate to a method for manufacturing a semiconductor structure.

BACKGROUND

In a semiconductor structure, metal silicides are widely applied to the local interconnection between contact electrodes and devices in drain, source and gate regions to obtain lower contact resistance in the drain, source and gate regions, thereby reducing the RC delay of the semiconductor structure and improving the performance of the semiconductor structure.

However, the applicant found that the metal silicides prepared in the related preparation technologies contain oxides which can increase the resistance of the metal silicides, thereby reducing the performance of the semiconductor structure.

FIG. 1 and FIG. 2 schematically show the structure corresponding to each step of a method for manufacturing a semiconductor structure in the related art. FIG. 3 is a time-temperature schematic diagram corresponding to FIG. 2.

With reference to FIG. 1 and FIG. 2, the manufacturing method of the semiconductor structure is analyzed.

Referring to FIG. 1, a base 100 is provided. The base 100 includes a metal layer 102 and an oxide 103 located on a surface of the metal layer 102.

The base 100 further includes a substrate 101 and dielectric layers 105 located on the surface of the substrate 101. There is a groove 104 in adjacent dielectric layers 105, for exposing the substrate 101. A metal layer 102 is located on the substrate 101 in the groove 104.

Referring to FIG. 2, the heat treatment is performed on the base 100 (referring to FIG. 1). After the heat treatment, the metal layer 102 (referring to FIG. 1) is converted into a metal compound layer 112.

The step of the heat treatment will be described in detail below with reference to FIG. 2 and FIG. 3.

Referring to FIG. 3, the horizontal axis represents the treatment time (Time) of the base (unit: s), and the longitudinal axis represents the treatment temperature (Temperature) of the base (unit: ° C.). S1 to S3 respectively represent the corresponding relationship between the treatment time and the treatment temperature of each step in the heat treatment.

Specifically, in FIG. 3, S1 represents a temperature rise stage, and in the stage S1, the temperature of the base 100 gradually rises. S2 represents a constant temperature stage, and in the stage S2, the base 100 is maintained at a constant temperature for a period of time, so that the material of the metal layer 102 located on the substrate 101 in the groove 104 is reacted with the material of the substrate 101, and the metal layer 102 is converted into the metal compound layer 112. S3 represents a temperature drop stage.

After S2 operation, the oxide 103 exists on the surface of the metal compound layer 112 and at an interface between the metal compound layer 112 and the substrate 101. The oxide 103 may be formed before the heat treatment.

Specifically, FIG. 2 shows the oxide 103 on the upper surface of the metal compound layer 112. That is, the oxide 103 is located on the surface of the metal compound layer 112 away from the substrate 101, and this portion of the oxide 103 can be called a natural oxide. The reason for forming the natural oxide is as follows. Generally, the metal layer 102 is deposited by a high temperature process, during which the metal for forming the metal layer 102 is diffused with silicon of the material of the substrate 101 mutually, resulting in that a certain amount of silicon exists on the surface of the metal layer 102, and at the same time, some unstable metal compounds are formed; and when the silicon on the surface of the metal layer 102 reacts with oxygen in the air, the natural oxide will be formed.

It can be understood that the oxide 103 may also be located on the lower surface of the metal compound 112. That is, the oxide 103 is located between the substrate 101 and the metal compound layer 112. The reason for forming this portion of the oxide 103 includes: before forming the metal layer 102, the substrate 101 reacts with oxygen in the air to form the oxide 103.

After the heat treatment process, the unreacted portion of the metal layer 102 is removed by a wet selective etching. After the wet selective etching, a first conductive layer 106 located at the bottom and side walls of the groove 104 and the top surface of the dielectric layer 105 is formed. After forming the first conductive layer 106, a second conductive layer 107 that fully covers the first conductive layer 106, is formed on the side of the first conductive layer 106 away from the substrate 101.

The oxide 103 located on the surface of the metal compound layer 112 cannot be completely removed by the wet selective etching, and the oxide 103 located at the interface between the metal compound layer 112 and the substrate 101 cannot be removed by the wet selective etching either. In addition, the oxide 103 has a higher resistance. Therefore, the resistance of the metal compound layer 112 is higher, which causes that the metal compound layer 112 and the first conductive layer 106 have a higher contact resistance, the formed semiconductor structure has RC delay, and the transmission of electrical signals is slow, affecting the performance of the semiconductor structure. In addition, when a plurality of oxides 103 are provided, the oxides 103 will be in contact with the dielectric layer 105 surrounding them, resulting in that the contact resistance of the metal compound layer 112 and the first conductive layer 106 is infinite. That is, the oxide 103 blocks the electrical connection between the metal compound layer 112 and the first conductive layer 106, which causes the semiconductor structure to be disconnected, causes the semiconductor structure to become invalid, and seriously reduces the yield rate and performance of the semiconductor structure.

SUMMARY

An objective of this disclosure is to provide a method for manufacturing a semiconductor structure to improve the performance of the semiconductor structure.

In order to solve the above technical problems, the examples of this disclosure provide a method for manufacturing a semiconductor structure. The method includes the following operations: providing a base that includes a metal layer and an oxide located on a surface of the metal layer; and, performing heat treatment on the base during which a reducing gas is introduced, and the metal layer is converted into a metal compound layer after the heat treatment.

In the examples of this disclosure, the base is subjected with the heat treatment, to convert the metal layer into a metal compound layer. The metal compound layer as a low-resistance conductive structure, can improve the RC delay caused by a high-resistance conductive structure, thereby improving the performance of the semiconductor structure. In addition, the reducing gas introduced during the heat treatment will enter the metal layer and react with the oxide on the surface of the metal layer to reduce the oxide. For example, the silicon oxide is reduced to silicon, and the reduced silicon and metal form a metal compound, thereby reducing the resistance of the metal compound layer. Therefore, in this disclosure, the metal layer is converted into the metal compound layer while reducing the oxide, thereby improving the performance of the semiconductor structure. Furthermore, compared with the related technologies that require two manufacturing processes to remove an oxide and form a metal compound layer respectively, this disclosure saves one manufacturing process, which can save the cost and improve the manufacturing efficiency of the semiconductor structure.

In addition, the reducing gas includes $NH_3$, and a gas flow of the reducing gas ranges from 5 slm to 30 slm. Within such range of the process parameter, it will have a better reduction effect on the oxide.

In addition, a material of the oxide includes silicon oxide.

In addition, a material of the metal layer includes Co, Ni, Ta or Ti. The resistance of the above-mentioned metal material is lower, i.e., the electrical conductivity of the metal layer is better, which can reduce the RC delay of the subsequently formed in the semiconductor structure, thereby improving the performance of the semiconductor structure.

In addition, the heat treatment includes the following operations: performing a first heat treatment step during which the reducing gas and a first auxiliary gas are introduced, the base is heated to a first temperature and maintained at the first temperature for a first period of time; and after the first heat treatment step, performing a second heat treatment step during which a second auxiliary gas is introduced, the base is heated to a second temperature greater than the first temperature, and maintained at the second temperature for a second period of time. Therefore, in this disclosure, while converting the metal layer into the metal compound layer, the oxide is reduced, thereby improving the performance of the semiconductor structure.

In addition, the first auxiliary gas or the second auxiliary gas includes $N_2$, He, Ar or Ne, and a gas flow of the first auxiliary gas or the second auxiliary gas ranges from 5 slm to 50 slm. Therefore, the oxide on the surface of the metal layer is heated uniformly, so that the oxide is reacted with the reducing gas at different positions at approximately the same rate, which can improve the reduction effect of the oxide.

In addition, a process pressure of the first heat treatment step or the second heat treatment step ranges from 750 torr to 850 torr. Within such range of this parameter, it will have a better reduction effect on the oxide.

In addition, in the first heat treatment step, a temperature rise rate of the base is 5° C./s to 20° C./s, the first temperature ranges from 300° C. to 600° C., and the first period of time ranges from 10 s to 60 s. Within such range of this parameter, the reduction reaction can be performed more thoroughly, that is, the oxide can be completely reduced.

In addition, in the second heat treatment step, a temperature rise rate of the base is 5° C./s to 20° C./s, the second temperature ranges from 700° C. to 800° C., and the second period of time ranges from 30 s to 50 s. Within such range of this parameter, it will obtain a metal compound layer with a thickness meeting the technical requirement.

In addition, a material of the metal compound layer includes $CoSi_x$, $NiSi_x$, $TaSi_x$ or $TiSi_x$. The resistance of the above-mentioned metal compound is lower than the resistance of the metal layer, so that the resistance of the semiconductor structure can be reduced, and the performance of the semiconductor structure can be improved.

The technical solutions provided by the examples of this disclosure have the following advantages.

In the example, the base is subjected with the heat treatment, to convert the metal layer into the metal compound layer. The metal compound layer as a low-resistance conductive structure, can improve the RC delay caused by the high-resistance conductive structure, thereby increasing the transmission speed of electrical signals in the semiconductor structure, and improving the performance of the semiconductor structure.

In addition, the reducing gas is also introduced during the heat treatment. Such reducing gas will enter the metal layer and react with the oxide on the surface of the metal layer to reduce the oxide, thereby reducing the resistance of the metal compound layer. Therefore, in this disclosure, the metal layer is converted into the metal compound layer while reducing the oxide, such as a metal oxide to a metal, so as to reduce the resistance of the metal compound layer, thereby improving the performance of the semiconductor structure. Furthermore, compared with the related technologies that require two manufacturing processes to remove an oxide and form a metal compound layer respectively, this disclosure saves one manufacturing process, which can save the cost, and improve the manufacturing efficiency of the semiconductor structure.

DETAILED DESCRIPTION

In order to solve the above problems, the examples of this disclosure provide a method for manufacturing a semiconductor structure. In this example, heat treatment is performed on the base, and the metal layer is converted into the metal compound layer. The metal compound layer as a low-resistance conductive structure, can improve the RC delay caused by a high-resistance conductive structure, thereby improving the performance of the semiconductor structure. In addition, the reducing gas introduced during the heat treatment will diffuse and enter the metal layer and take place a reduction reaction with the oxide on the surface of the metal layer to reduce the oxide, thereby reducing the resistance of the metal compound layer. Therefore, in this disclosure, the metal layer is converted into the metal compound layer while reducing the oxide, thereby improving the performance of the semiconductor structure. Furthermore, compared with the related technologies that require multiple manufacturing processes to remove an oxide and form a metal compound layer, respectively, this disclosure saves one manufacturing process. That is, the removal of oxide and the formation of the metal compound layer can be performed in the same chamber of the same machine in the manufacturing process, so that the cost can be saved, and the manufacturing efficiency of the semiconductor structure can be improved.

In order to make the objectives, technical solutions and advantages of the examples of this application clearer, the examples of this disclosure will be described in below with reference to the accompanying drawings for details. However, it should be understood for a person of ordinary skill in the art that although in the examples of this disclosure, many technical details are proposed to better understand this discourse for readers. the technical solutions claimed in this disclosure can also be realized even without these technical details and with various changes and modifications based on the following examples. The division of the following examples is used for the convenience of description, and should not constitute any limitation on the specific implementation manners of this disclosure. The examples can be combined and cited with each other without contradiction.

Figure 1:
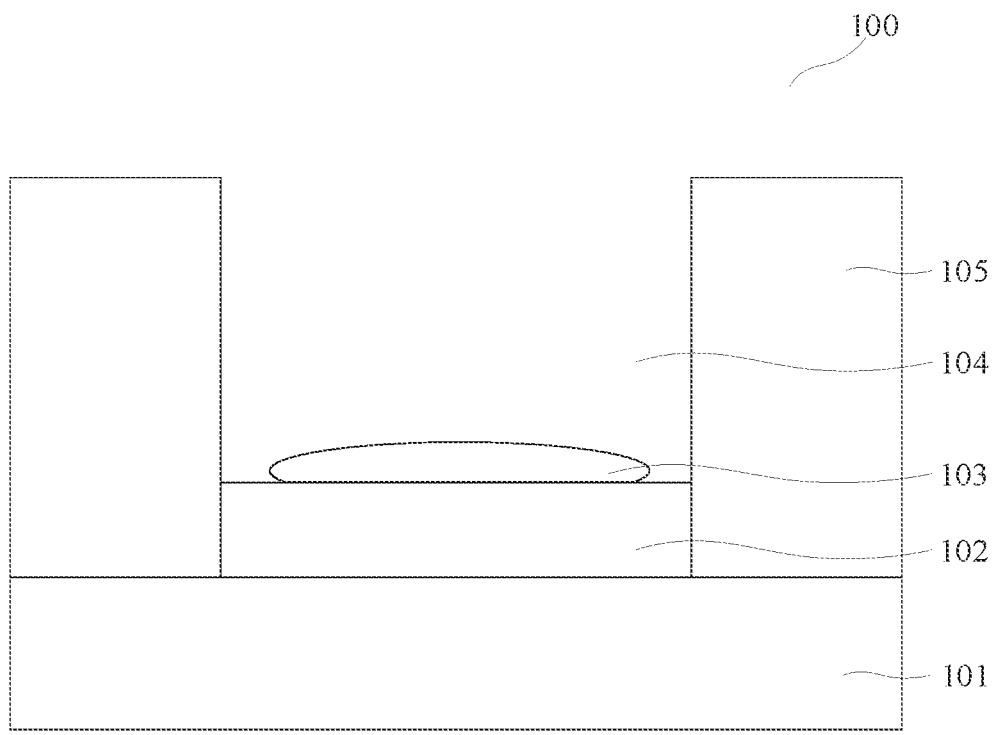
FIG. 1 and FIG. 2 schematically show the structure corresponding to each step of the method for manufacturing the semiconductor structure in prior art.
Figure 2:
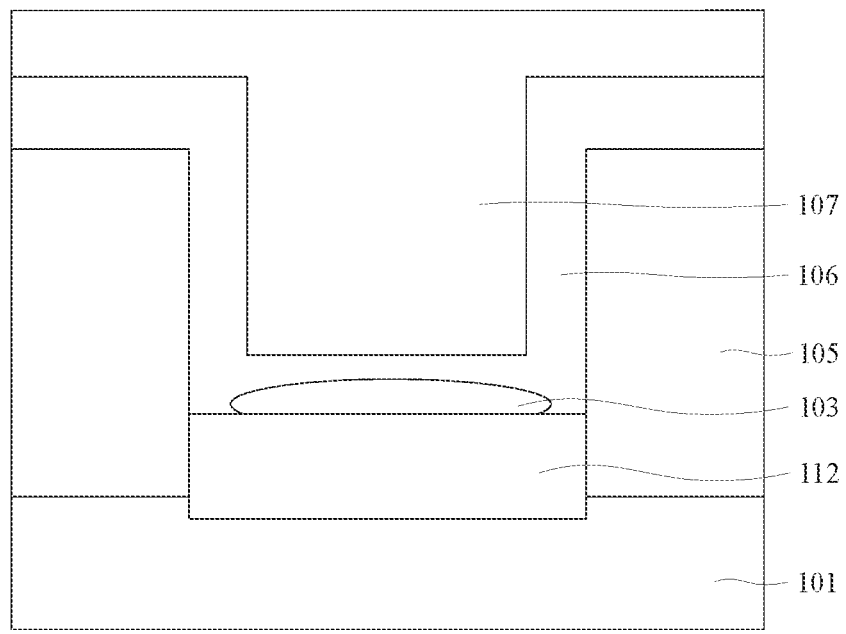
Figure 3:
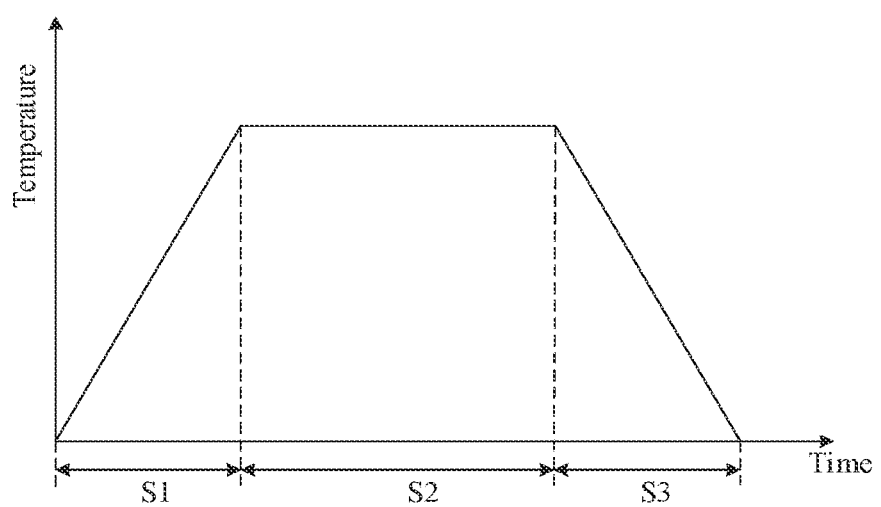
FIG. 3 is a time-temperature schematic diagram corresponding to each step of the method for manufacturing the semiconductor structure in prior art.
Figure 4:
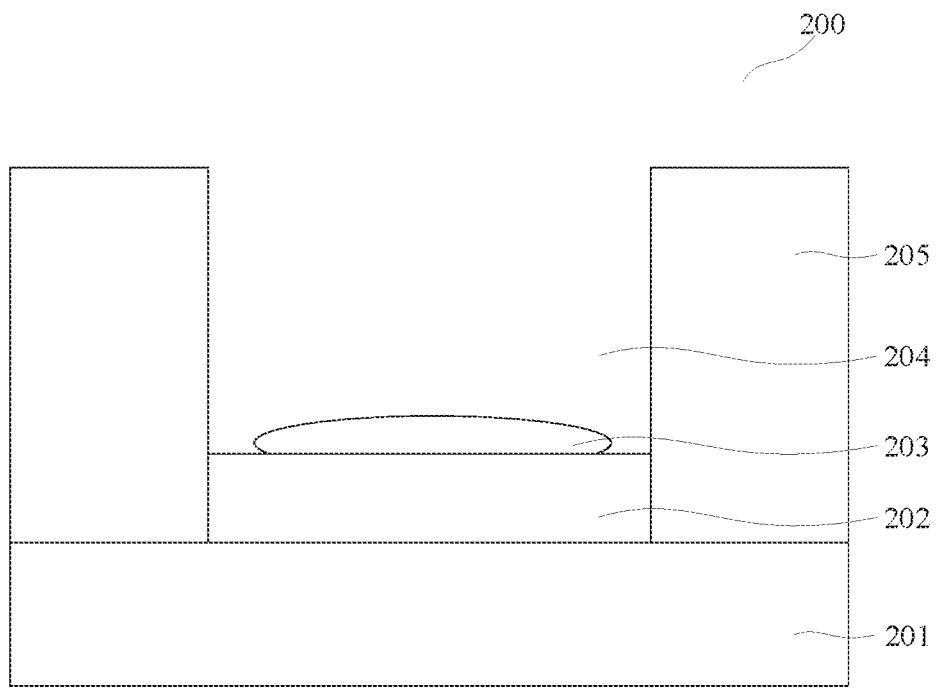
FIG. 4 to FIG. 6 schematically show the structure corresponding to the method for manufacturing the semiconductor structure provided by an example of this disclosure.
Figure 5:
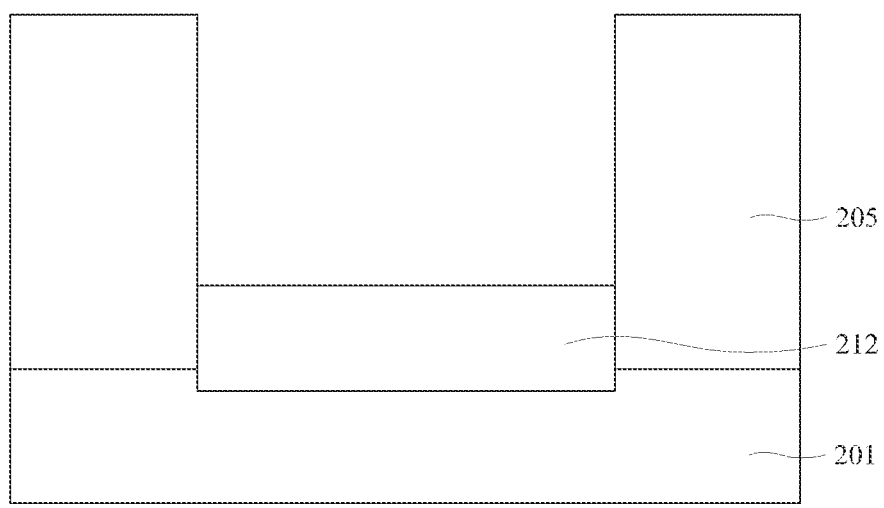
Figure 6:
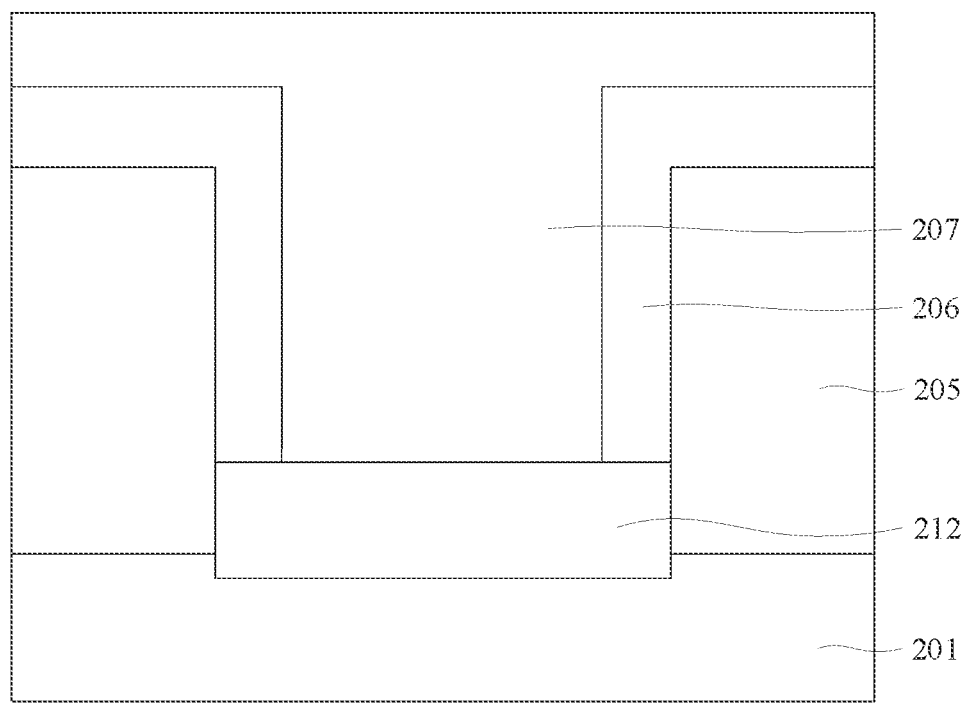
Figure 7:
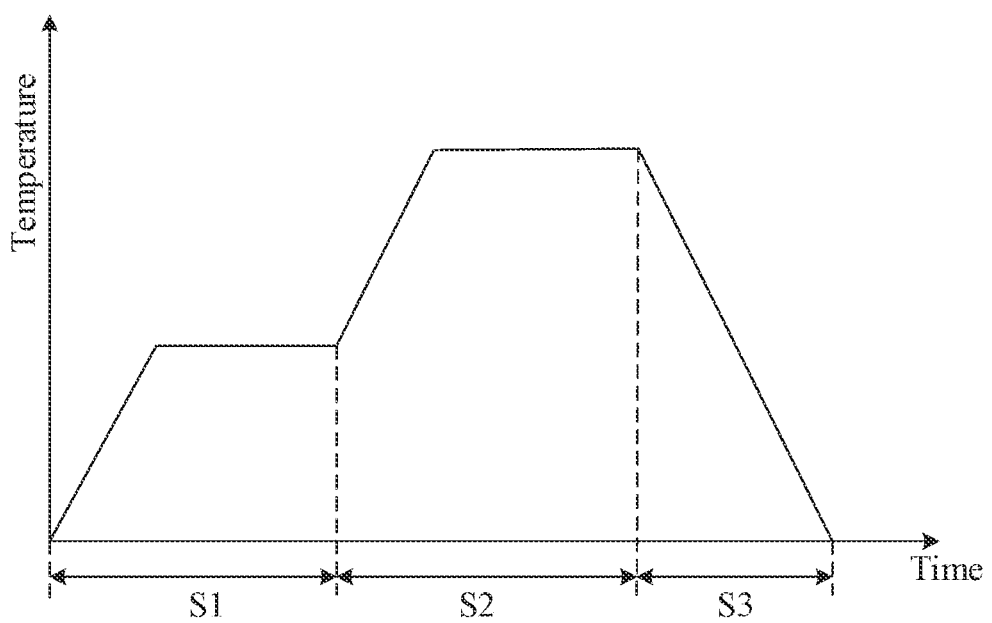
FIG. 7 is a time-temperature schematic diagram corresponding to each step of the method for manufacturing the semiconductor structure provided by an example of this disclosure.

FIG. 4 to FIG. 6 schematically show the structure corresponding to the method for manufacturing the semiconductor structure provided by an example of this disclosure. FIG. 7 is a time-temperature schematic diagram corresponding to each step of the method for manufacturing the semiconductor structure provided by an example of this disclosure.

Referring to FIG. 4, a base 200 is provided, and the base 200 includes a metal layer 202 and an oxide 203 located on a surface of the metal layer 202.

In this example, the base 200 further includes a substrate 201 and a dielectric layer 205 located on the surface of the substrate 201. There is a groove 204 in the dielectric layer 205, for exposing the substrate 201. A metal layer 202 is located on the substrate 201 in the groove 204.

The material of the substrate 201 is a semiconductor material, such as silicon, polysilicon, silicon germanide and silicon carbide. In this example, the material of the substrate 201 is any one of polysilicon or silicon.

In this example, the material of the metal layer 202 includes Co, Ni, Ta or Ti.

In this example, the material of the oxide 203 includes a silicon oxide. In other examples, the material of the oxide 203 may also include a cobalt oxide, a nickel oxide, a tantalum oxide or a titanium oxide.

The oxygen atoms in the oxide 203 have different sources, resulting in the formation of the oxide 203 at different positions. Specifically, the formation includes: before depositing the metal layer 202, the substrate 201 is in contact with oxygen atoms in the air, so that the oxide 203 exists at the interface between the metal layer 202 and the substrate 201, and is located on the lower surface of the metal layer 202; during a process of depositing the metal layer 202 that is generally a high temperature process, the metal for forming the metal layer 102 is diffused with silicon of the material of the substrate 201 mutually, resulting in that a certain amount of silicon exists on the surface of the metal layer 202, and at the same time, some unstable metal compounds are formed; and when the silicon on the surface of the metal layer 202 reacts with oxygen in the air, the oxide 203 is formed, and the oxide 203 is located on the upper surface of the metal layer 202.

In an example, the metal layer 202 may be located on the surface of a source region or a drain region. In another example, the metal layer 202 may also be located on the surface of polysilicon of a gate structure.

Referring to FIG. 5, in this example, heat treatment is performed on the base 200, a reducing gas is introduced during the heat treatment. After the heat treatment, the metal layer 202 (referring to FIG. 4) is converted into a metal compound layer 212.

The metal layer 202 serves as a conductive contact structure. In order to reduce the contact resistance of the conductive structure to improve the electrical conductivity of the conductive structure, heat treatment is performed on the base 200. At a certain temperature, a diffusion reaction occurs between the material of the metal layer 202 and the material of the substrate 201, so that the metal layer 202 is converted into the metal compound layer 212. Therefore, the objective of reducing the resistance of the conductive structure can be achieved.

Specifically, in an example, the metal layer 202 may be formed on the surfaces of the source region, the drain region and the gate structure. After the heat treatment, the metal layer 202 on the surfaces of the source region, the drain region and the gate structure is converted into the metal compound layer 212. Therefore, the equivalent series resistance of the source region, the drain region and the gate structure of the transistor, as well as the contact resistance with contact holes can be improved at the same time, thereby achieving the objective of reducing the resistance of the conductive structure.

In addition, after the metal layer 202 is converted into the metal compound layer 212, the oxide 203 is located on the surface of the metal compound layer 212. Furthermore, the oxide 203 cannot be completely removed by the wet selective etching technology in related technologies, and the oxide 203 will increase the contact resistance of the metal compound layer 212 and reduce the electrical conductivity of the metal compound layer 212, so that the performance of the subsequently formed semiconductor structure is reduced.

In this example, during the heat treatment, when the temperature rises to a reaction temperature, the material of the metal layer 202 reacts with the material of the substrate 201, so that the metal layer 202 is converted into the metal compound layer 212. In addition, the reducing gas is introduced during the heat treatment, then enter the metal layer 202 and generate a reduction reaction with the oxide 203 on the surface of the metal layer 202 to reduce the oxide 203 to reduce the resistance of the metal compound layer 212, for example, the silicon oxide is reduced to silicon, and the reduced silicon and metal form a metal silicide. Therefore, this example can convert the metal layer 202 into the metal compound layer 212 while reducing the oxide 203, thereby improving the performance of the semiconductor structure. Furthermore, compared with the related technologies that require two manufacturing processes to remove the oxide 203 and form a metal compound layer 212 respectively, this disclosure saves one manufacturing process, which can save the cost, and improve the manufacturing efficiency of the semiconductor structure.

The heat treatment process will be described in detail below with reference to FIG. 7.

Referring to FIG. 7, the horizontal axis represents the treatment time (Time) of the base (unit: s), and the longitudinal axis represents the treatment temperature (Temperature) of the base (unit: ° C.). S1 to S3 respectively represent the corresponding relationship between the treatment time and the treatment temperature of each step in the heat treatment.

The heat treatment includes the following operations. While a first heat treatment step is performed, a reducing gas and a first auxiliary gas are introduced. The base 200 is heated to a first temperature, and the base 200 is maintained at the first temperature for a first period of time. S1 in FIG. 7 shows the first heat treatment step.

In the process S1, the base 200 is disposed in a machine chamber, the reducing gas and the first auxiliary gas are introduced into the machine chamber, and the base 200 is heated to the first temperature. The reducing gas can be in contact with the oxide 203 on the surface of the metal layer 202, enters into the metal layer 202, contacts with the oxide 203 in the metal layer 202, and reacts with the oxide 203 on the surface of the metal layer 202 when the temperature of the base 200 rises to the first temperature, so that the oxide 203 generates a reduction reaction. After the base 200 is maintained at the first temperature for the first period of time, the oxide 203 is completely reduced, thereby removing the oxide 203.

In this example, the machine used for the heat treatment may be RTP Machine.

In other examples, the machine used for heat treatment may also be other eligible machines.

In this example, the reducing gas includes $NH_3$. Taking the oxide 203 as a silicon oxide as an example, the chemical reaction between the reducing gas and the silicon oxide is as follows:

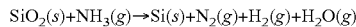

$$SiO_2(s) + NH_3(g) \rightarrow Si(s) + N_2(g) + H_2(g) + H_2O(g)$$

That is, in the process S1, the oxide 203 is decomposed into gas and Si. The gas can escape, and Si as a reactant can react with the material of the metal layer 202 in the subsequent process. Therefore, this example can remove the oxide 203 without introducing other impurities, and can also reduce $SiO_2$ to Si so as to provide a reactant for the subsequent manufacturing process.

In other examples, the reducing gas may also be $NH_3$, $H_2$ or $SF_6$.

In addition, when the oxide 203 is a metal oxide, the reducing gas and the metal oxide take place a redox reaction to reduce the metal oxide to a metal, so that the resistance of the metal layer 202 can be reduced, and the reduced metal may also serve as a reactant to participate in the reaction in the subsequent process.

In this example, the gas flow of the reducing gas ranges from 5 slm to 30 slm, such as 10 slm, 20 slm and 25 slm. Within such range of this parameter, the reduction effect of the oxide 203 is better.

In addition, when the first auxiliary gas is introduced into the chamber, the gas can play a function of "stirring" due to the fluidity thereof. The heat is carried around the base 200, and thus the base 200 can be heated uniformly. The oxide 203 located on the surface of the metal layer 202 can also be heated uniformly, and thus the chemical reaction rates of the oxides 203 at different positions are approximately the same. Therefore, the reduction effect of the oxide 203 can be improved. Furthermore, the introduction of the auxiliary gas can ensure a low oxygen content in the chamber to prevent oxygen from continuing to react with silicon on the surface of the metal layer 202 to form silicon oxide during the heat treatment.

In this example, the first auxiliary gas includes $N_2$, He, Ar or Ne, and the gas flow of the first auxiliary gas ranges from 5 slm to 50 slm. Within such range of this parameter, the reduction effect of the oxide 203 is better.

In this example, the process pressure of the first heat treatment step ranges from 750 torr to 850 torr. Under such range of this parameter, the reduction effect of the oxide 203 is better.

In this example, in the first heat treatment step, the temperature rise of the base 200 is 5° C./s to 20° C./s, the first temperature ranges from 300° C. to 600° C., and the first period of time ranges from 10 s to 60 s. In a specific example, the temperature rise rate of the base 200 is 10° C./s to 15° C./s, such as 12° C./s and 13° C./s; the first temperature is 400° C. to 500° C., such as 440° C., 450° C. and 480° C., and the first period of time is 20 s to 40 s.

When the first temperature ranges from 300° C. to 600° C., the oxide 203 starts to take place a reduction reaction with the reducing gas. When the first period of time ranges from 10 s to 60 s, the reduction reaction is performed more thoroughly. That is, the oxide 203 is completely reduced to silicon, and silicon can participate in subsequent reactions.

In addition, when the temperature rise rate of the base 200 ranges from 5° C./s to 20° C./s, the temperature distribution on the base 200 is relatively uniform, thereby avoiding the difference in the reaction rate of the oxides 203 at different positions and the reducing gas caused by uneven temperature distribution, which leads to a poor reduction effect of the oxide 203 and the problem of the remaining oxide 203.

In addition, it should also be noted that during the process of maintaining the base 200 at the first temperature for the first period of time, a part of the metal layer 202 reacts with the substrate 201. Since the first temperature is lower, unstable reaction products are formed. For example, when the reaction temperature is 300° C. to 500° C., the reaction product includes CoSi; when the reaction temperature is 400° C. to 600° C., the reaction product includes $Co_2Si$.

After the first heat treatment step is performed, the second heat treatment step is performed. In FIG. 7, S2 shows the second heat treatment step.

In the process S2, a second auxiliary gas is introduced, the base 200 is heated to a second temperature, the base 200 is maintained at the second temperature for a second period of time, and the second temperature is greater than the first temperature.

Since the oxide 203 is completely decomposed into silicon and gas after the process S1, the introduction of the reducing gas can be stopped in the process S2. When the base 200 is heated to the second temperature, the metal layer 202 begins to take place a diffusion reaction with the substrate 201, and the metal of the metal layer 202 is converted into a metal compound. After the base 200 is maintained at the second temperature for the second period of time, the metal layer 202 is converted into the metal compound layer 212.

In this example, the second auxiliary gas includes $N_2$, He, Ar or Ne, and the gas flow of the second auxiliary gas ranges from 5 slm to 50 slm.

Similarly, the second auxiliary gas can improve the heating uniformity of the base 200, thereby increasing the reaction efficiency of the metal layer 202. The second auxiliary gas may be the same as the first auxiliary gas or different from the first auxiliary gas.

In this example, in the second heat treatment step, the temperature rise rate of the base 200 is 5° C./s to 20° C./s, the second temperature ranges from 700° C. to 800° C., and the second period of time ranges from 30 s to 50 s.

In the second heat treatment step, when the temperature rise rate of the base 200 is 5° C./s to 20° C./s, it can ensure that the temperature distribution on the base 200 is relatively uniform. That is, the temperature at each part of the metal layer 202 is approximately the same, so that the reaction rate at each part of the metal layer 202 is the same, so as to improve the reaction efficiency and the conversion effect.

When the second temperature ranges from 700° C. to 800° C., the reaction product of the metal layer 202 and the substrate 201 is a stable compound, and the unstable metal compound produced in the process S1 can also be converted into the stable metal compound. When the second period of time ranges from 30 s to 50 s, it provide a sufficient time for the reaction. That is, after the second period of time, the metal layer 202 is completely converted into the metal compound, and the resulting metal compound layer 212 will have a thickness that meets the technical requirement.

Specifically, the material of the metal compound layer 212 includes $CoSi_2$, $NiSi_x$, $TaSi_x$ or $TiSi_x$. The resistance of the above-mentioned metal compound is lower than the resistance of the metal layer 202, so that the resistance of the semiconductor structure can be reduced, and the performance of the semiconductor structure can be improved.

In this example, the process pressure of the second heat treatment step ranges from 750 torr to 850 torr. Under such range of this parameter, the reaction effect of the metal layer 202 and the substrate 201 is better.

After the process S2, cooling treatment is performed on the base 200. In FIG. 7 S3 shows the cooling treatment step.

After the heat treatment process, the metal layer 202 is completely converted into the metal compound layer 212, and the oxide 203 is completely decomposed into silicon and gas.

It should be noted that in other examples, during the heat treatment of the base 200, the reducing gas, the first auxiliary gas and the second auxiliary gas may also be continuously introduced.

Referring to FIG. 6, the subsequent process steps may include the following operations: removing the unreacted portion of the metal layer (not shown) by a wet selective etching technology; after the wet selective etching technology, forming a first conductive layer 206 located at the bottom and side walls of the groove 204 (referring to FIG. 4) and the top surface of the dielectric layer 205; and after forming the first conductive layer 206, forming a second conductive layer 207 which completely covers the first conductive layer 206 on a side of the first conductive layer 206 away from the substrate 201.

In this example, the first conductive layer 206 and the second conductive layer 207 can be formed by direct current sputtering and chemical vapor deposition methods.

The material of the first conductive layer 206 includes TiN or TaN, and the material of the second conductive layer 207 includes Ti, W, Ta, Al or Ni.

In this example, heat treatment is performed on the base 200, and the metal layer 202 is converted into the metal compound layer 212. Since the resistance of the metal compound layer 212 is lower than the resistance of the metal layer 202, the metal compound layer 212 as a low-resistance conductive structure, can improve the RC delay caused by a high-resistance conductive structure and increase the transmission speed of electrical signals in the semiconductor structure, thereby improving the performance of the semiconductor structure.

In addition, the reducing gas is introduced in the first heat treatment step. When the temperature rises to the reaction temperature, the material of the metal layer 202 reacts with the material of the substrate 201, so that the metal layer 202 is converted into the metal compound layer 212. Furthermore, the reducing gas enters the metal layer 202 and takes place a reduction reaction with the oxide 203 on the surface of the metal layer 202 to decompose the oxide 203, thereby reducing the resistance of the metal compound layer 212. Therefore, this disclosure can reduce the oxide 203 while converting the metal layer 202 into the metal compound layer 212, thereby improving the performance of the semiconductor structure. Furthermore, compared with the related technologies that require two manufacturing processes to respectively remove the oxide 203 and form the metal compound layer 212, this disclosure saves one manufacturing process, which can save the cost, and improve the manufacturing efficiency of the semiconductor structure.

It can be understood for a person of ordinary skill in the art that the above examples are specific examples for implementing this application. In practical applications, various changes can be made in form and details without departing from the spirit and scope of this application.

The invention claimed is:

1. A method for manufacturing a semiconductor structure, comprising:
   providing a base, wherein the base comprises a metal layer and an oxide located on a surface of the metal layer, wherein a material of the oxide comprises a silicon oxide; and
   performing heat treatment on the base, the heat treatment comprising:
      performing a first heat treatment step by introducing a reducing gas for removing the oxide and a first auxiliary gas and by heating the base to a first temperature and maintaining the base at the first temperature for a first period of time; and
      after the first heat treatment step, performing a second heat treatment step by introducing a second auxiliary gas and by heating the base to a second temperature and maintaining the base at the second temperature for a second period of time, wherein the second temperature is greater than the first temperature, and the metal layer is converted into a metal compound layer during the second heat treatment step, and
      wherein a gas flow of the reducing gas ranges from 5 slm to 30 slm.

2. The method for manufacturing the semiconductor structure of claim 1, wherein a material of the metal layer comprises Co, Ni, Ta or Ti.

3. The method for manufacturing the semiconductor structure of claim 1, wherein the first auxiliary gas or the second auxiliary gas comprises $N_2$, He, Ar or Ne, and a gas flow of the first auxiliary gas or the second auxiliary gas ranges from 5 slm to 50 slm.

4. The method for manufacturing the semiconductor structure of claim 1, wherein a process pressure of the first heat treatment step and a process pressure of the second heat treatment step range from 750 torr to 850 torr.

5. The method for manufacturing the semiconductor structure of claim 1, wherein in the first heat treatment step, a temperature rise rate of the base is 5° C./s to 20° C./s, the first temperature ranges from 300° C. to 600° C., and the first period of time ranges from 10 s to 60 s.

6. The method for manufacturing the semiconductor structure of claim 5, wherein in the first heat treatment step, the temperature rise rate of the base is 10° C./s to 15° C./s, the first temperature ranges from 400° C. to 500° C., and the first period of time ranges from 20 s to 40 s.

7. The method for manufacturing the semiconductor structure of claim 1, wherein in the second heat treatment step, a temperature rise rate of the base is 5° C./s to 20° C./s, the second temperature ranges from 700° C. to 800° C., and the second period of time ranges from 30 s to 50 s.

8. The method for manufacturing the semiconductor structure of claim 1, wherein a material of the metal compound layer comprises $CoSi_2$, $NiSi_x$, $TaSi_x$ or $TiSi_x$.

9. The method for manufacturing the semiconductor structure of claim 1, wherein the reducing gas is $NH_3$, $H_2$ or $SF_6$.

10. The method for manufacturing the semiconductor structure of claim 1, wherein the base further comprises a substrate, a dielectric layer located on a surface of the substrate, and a groove in the dielectric layer for exposing the substrate.

11. The method for manufacturing the semiconductor structure of claim 10, further comprising:
 removing an unreacted portion of the metal layer;
 forming a first conductive layer at a bottom and side walls of the groove and a top surface of the dielectric layer; and
 forming a second conductive layer which completely covers the first conductive layer on a side of the first conductive layer away from the substrate.

12. The method for manufacturing the semiconductor structure of claim 11, wherein a material of the first conductive layer comprises TiN or TaN, and a material of the second conductive layer comprises Ti, W, Ta, Al or Ni.

13. The method for manufacturing the semiconductor structure of claim 1, wherein the oxide further exists at an interface between the metal layer and a substrate comprised in the base.

14. The method for manufacturing the semiconductor structure of claim 1, wherein the oxide is natural oxide.

15. A method for manufacturing a semiconductor structure, comprising:
 providing a base, wherein the base comprises a metal layer and an oxide located on a surface of the metal layer; and
 performing heat treatment on the base, the heat treatment comprising:
  performing a first heat treatment step by introducing a reducing gas for removing the oxide and a first auxiliary gas and by heating the base to a first temperature and maintaining the base at the first temperature for a first period of time; and
  after the first heat treatment step, performing a second heat treatment step by introducing a second auxiliary gas and by heating the base to a second temperature and maintaining the base at the second temperature for a second period of time, wherein the second temperature is greater than the first temperature, and the metal layer is converted into a metal compound layer during the second heat treatment step, wherein a material of the metal compound layer comprises $CoSi_2$, $NiSi_x$, $TaSi_x$ or $TiSi_x$, and
 wherein a gas flow of the reducing gas ranges from 5 slm to 30 slm.

16. A method for manufacturing a semiconductor structure, comprising:
 providing a base, wherein the base comprises a metal layer and an oxide located on a surface of the metal layer, wherein the oxide further exists at an interface between the metal layer and a substrate comprised in the base; and
 performing heat treatment on the base, the heat treatment comprising:
  performing a first heat treatment step by introducing a reducing gas for removing the oxide and a first auxiliary gas and by heating the base to a first temperature and maintaining the base at the first temperature for a first period of time; and
  after the first heat treatment step, performing a second heat treatment step by introducing a second auxiliary gas and by heating the base to a second temperature and maintaining the base at the second temperature for a second period of time, wherein the second temperature is greater than the first temperature, and the metal layer is converted into a metal compound layer during the second heat treatment step, and
 wherein a gas flow of the reducing gas ranges from 5 slm to 30 slm.

* * * * *